United States Patent
Unger

(10) Patent No.: US 9,618,627 B2
(45) Date of Patent: Apr. 11, 2017

(54) METHOD FOR MEASURING A SIDE SLIP ANGLE IN VEHICLES

(71) Applicant: AUDI AG, Ingolstadt (DE)

(72) Inventor: Andreas Unger, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/229,933

(22) Filed: Aug. 5, 2016

(65) Prior Publication Data

US 2017/0038476 A1 Feb. 9, 2017

(30) Foreign Application Priority Data

Aug. 6, 2015 (DE) .................. 10 2015 010 173

(51) Int. Cl.
| | | |
|---|---|---|
| *G01S 19/47* | (2010.01) | |
| *G01C 21/16* | (2006.01) | |
| *G01S 19/52* | (2010.01) | |
| *G01S 19/53* | (2010.01) | |

(52) U.S. Cl.
CPC .............. *G01S 19/47* (2013.01); *G01C 21/16* (2013.01); *G01S 19/52* (2013.01); *G01S 19/53* (2013.01)

(58) Field of Classification Search
CPC .......... G01S 19/47; G01S 19/52; G01S 19/53; G01C 21/16
See application file for complete search history.

(56) References Cited

U.S. PATENT DOCUMENTS

| 6,219,609 B1 * | 4/2001 | Matsuno .............. B60T 8/1755 |
| | | 303/140 |
| 9,397,534 B2 | 7/2016 | Koch et al. |
| 2004/0128036 A1 | 7/2004 | Arndt |

FOREIGN PATENT DOCUMENTS

| DE | 198 29 582 C1 | 3/2000 |
| DE | 102 47 991 A1 | 4/2004 |
| DE | 10 2008 013 102 A1 | 4/2009 |
| DE | 10 2013 224 305 A1 | 5/2015 |

* cited by examiner

*Primary Examiner* — Basil T Jos
(74) *Attorney, Agent, or Firm* — Henry M. Feiereisen LLC.

(57) ABSTRACT

A method for determining a side slip angle in a vehicle, includes determining with a first sensor an orientation of an effective vehicle speed vector of the Vehicle in relation to a geographic coordinate system of the earth; determining with a second sensor an orientation of the vehicle in relation to a magnetic coordinate system of the earth magnetic field; determining a differential angle of the magnetic north direction of the earth relative to the geographic north direction of the earth by using a vehicle speed; and determining the side slip angle as a function of the orientation of the effective vehicle speed vector and the differential angle according to the relationship $\beta = \psi_{course} + \psi_{mag,\Delta} - \psi_{mag}$, wherein $\beta$ designates the side slip angle, $\psi_{mag,\Delta}$ the differential angle, $\psi_{mag}$ the orientation of the vehicle in relation to the magnetic north direction and $\psi_{course}$ the orientation of the vehicle speed vector.

9 Claims, 2 Drawing Sheets

METHOD FOR MEASURING A SIDE SLIP ANGLE IN VEHICLES

CROSS-REFERENCES TO RELATED APPLICATIONS

This application claims the priority of German Patent Application, Serial No. 10 2015 010 173.0, filed Aug. 6, 2015, pursuant to 35 U.S.C. 119(a)-(d), the content of which is incorporated herein by reference in its entirety as if fully set forth herein.

BACKGROUND OF THE INVENTION

The present invention relates to a method for measuring a side slip angle in vehicles.

The following discussion of related art is provided to assist the reader in understanding the advantages of the invention, and is not to be construed as an admission that this related art is prior art to this invention.

In the literature diverse methods for determining the side slip angle are described. For example optical methods, involving camera systems or a Correvit sensor or the measurement via GPS (global positioning system)-antennas are used. Because a GPS-antenna only enables measurement of the movement of a point but not its orientation at least two GPS antennas are required for measuring the side slip angle.

There are also numerous methods for estimating the side slip angle from variables that can be directly measured such as the transverse acceleration, the yaw rate, the vehicle speed and the steering angle.

It would be desirable and advantageous to provide an improved method for determining a side slip angle in vehicles.

SUMMARY OF THE INVENTION

According to one aspect of the present invention, a method for determining a side slip angle in a vehicle, includes determining with a first sensor an orientation of an effective vehicle speed vector of the vehicle in relation to a geographic coordinate system of the earth; determining with a second sensor an orientation of the vehicle in relation to a magnetic coordinate system of the earth magnetic field; determining a differential angle of the magnetic north direction of the earth relative to the geographic north direction of the earth by using a vehicle speed; and determining the side slip angle as a function of the orientation of the effective vehicle speed vector and the differential angle according to the relationship $\beta = \psi_{course} + \psi_{mag,\Delta} - \psi_{mag}$, wherein $\beta$ designates the side slip angle, $\psi_{mag,\Delta}$ the differential angle, $\psi_{mag}$ the orientation of the vehicle in relation to the magnetic north direction and $\psi_{course}$ the orientation of the vehicle speed vector.

According to another advantageous feature of the invention, a satellite navigation system is used as first sensor which includes a receiver and an antenna.

According to another advantageous feature of the invention, the satellite navigation system determines a vehicle speed in geographic north direction and a vehicle speed in geographic east direction. The effective vehicle speed vector can then be determined via vector addition of the vehicle speed in geographic north direction and the vehicle speed in geographic east direction.

According to another advantageous feature of the invention, a magnetic field sensor is used as second sensor which is installed along the vehicle longitudinal axis.

According to another advantageous feature of the invention, a two-axis magnetic field sensor is used for determining a magnetic field strength in vehicle longitudinal direction and a magnetic field strength in vehicle transverse direction.

According to another advantageous feature of the invention, it is assumed for determining the differential angle that the effective vehicle speed angle changes its sign wherein the side slip angle is zero.

According to another advantageous feature of the invention, the side slip angle is assumed to be zero at least for so long until the vehicle speed in geographic north direction and the vehicle speed in geographic east direction are provided by the satellite navigation system, wherein as soon as the vehicle speed in geographic north direction and the vehicle speed in geographic east direction are provided, the differential angle is determined once according to $\psi_{mag,\Delta} = \psi_{mag} - \psi_{course}$, wherein $\psi_{mag,\Delta}$ designates the differential angle, $\psi_{mag}$ The orientation of the vehicle in relation to the magnetic north direction or the yaw angle and $\psi_{course}$ the orientation of the effective vehicle speed vector in relation to the geographic coordinate system, i.e., the geographic north direction or the course angle.

According to another advantageous feature of the invention, additional measurement variables are used that recognize driving situations for which the side slip angle is zero, wherein the differential angle for each of these driving situations is stored and the differential angle is formed according to the relationship $$\psi_{mag,\Delta} = \frac{1}{n}\sum_n \psi_{mag,\Delta,n},$$

wherein $\psi_{mag,\Delta}$ designates the differential angle and $\psi_{mag,\Delta,n}$ the differential angle of a driving situation for which the side slip angle is zero.

Further advantages and embodiments of the invention will become apparent from the description and the included drawings.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
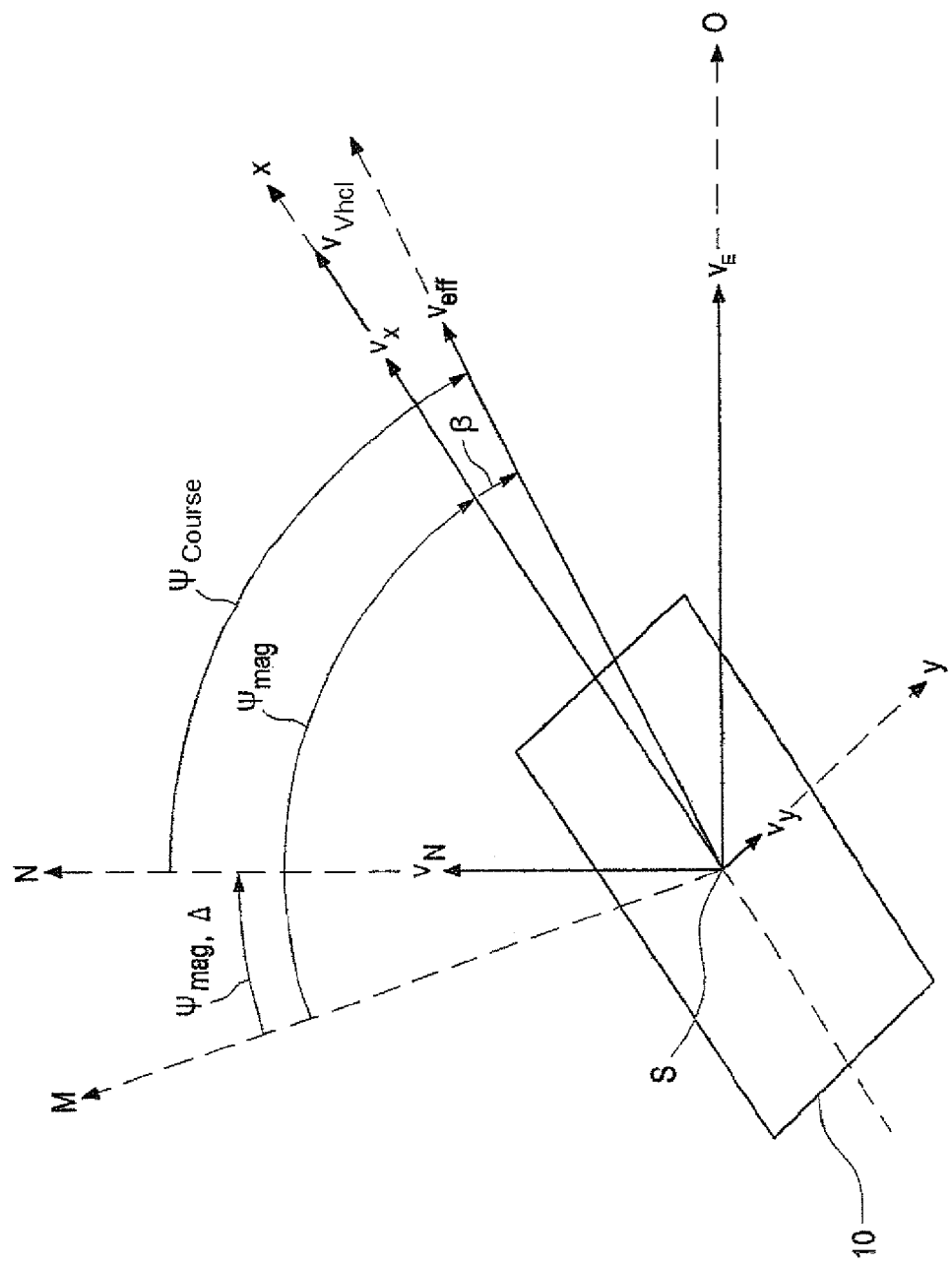
FIG. 1 shows a schematic representation of angles, which can occur in different coordinate systems on a motor vehicle.

Throughout all the Figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

FIG. 1 shows a schematic view onto a vehicle 10. In the center of mass of the vehicle 10 two coordinate systems that are projected onto the ground have their common origin. A first coordinate system represents a vehicle-fixed local coordinate system and is indicated by the axes x and y. The x axis hereby represents a vehicle longitudinal axis. The y axis represents a vehicle transverse axis. A second coordinate system represents a global geographic coordinate system and is characterized by the directions N for north and E for east, wherein the origin is vehicle-fixed.

FIG. 1 also shows different vectors. In the vehicle-fixed, local coordinate system the vector $v_x$ describes a vehicle longitudinal speed in the direction of the vehicle longitudinal axis x. Via for example wheel rotational speed sensors of the vehicle a vehicle speed $v_{vhcl}$ is determined which substantially points in vehicle longitudinal direction x. During straight ahead driving in the absence of wheel slip the vehicle speed $v_{vhcl}$ corresponds to the vehicle longitudinal speed $v_x$. The vector $v_y$ describes a vehicle speed in the direction of the vehicle transverse axis y. From these two components a vector for an effective vehicle speed $v_{eff}$ can be determined by vector addition. In the presence of a transverse component $v_y$ the effective vehicle speed vector $v_{eff}$ has an angle relative to the vehicle longitudinal axis which is referred to as β and defines the side slip angle. When the vehicle longitudinal speed $v_x$ and the vehicle transverse speed $v_y$ are known the side slip angle β can be determined by the relationship $β = a\tan 2(v_y, v_x)$. The mathematical function a tan 2 is hereby defined as follows:

$$a\tan2(y, x) = \begin{cases} \arctan\left(\frac{y}{x}\right) & x > 0 \\ \arctan\left(\frac{y}{x}\right) + \Pi & x < 0, y \geq 0 \\ \arctan\left(\frac{y}{x}\right) - \Pi & x < 0, y < 0 \\ \frac{\Pi}{2} & x = 0, y > 0 \\ -\frac{\Pi}{2} & x = 0, y < 0 \\ 0 & x = 0, y = 0 \end{cases}$$

In the geographical coordinate system the vector $v_N$ describes a vehicle speed in geographical north direction N. The vector $v_E$ describes a vehicle speed in geographical east direction E. Also from these two components $v_N$ and $v_E$ the effective vehicle speed $v_{eff}$ can be determined by vector addition.

The vector of the effective vehicle speed $v_{eff}$ describes in the geographic coordinate system the direction in which the center of mass S of the vehicle 10 moves over the ground. The direction in which the vehicle 10 moves is referred to as course and is blotted in relation to the axis N in the geographic coordinate system. The angle enclosed by the vector of the effective vehicle speed $v_{eff}$ and the geographic north direction N of the geographic coordinate system is referred to as course angle $\psi_{course}$. The course angle $\psi_{course}$ can be determined via the relationship $\psi_{course} = a\tan 2(v_E, v_N)$.

The orientation of the vehicle longitudinal axis x and with this the vehicle longitudinal speed $v_x$ relative to a magnetic north direction M of the earth magnetic field is referred to a magnetic course or magnetic course angle $\psi_{mag}$ or also as yaw angle. Because the direction relative to the magnetic north pole M does not necessarily correspond to the direction to the geographic north pole N a differential angle $\psi_{mag,\Delta}$ results between the magnetic north direction M and the geographic north direction N. also an error in the mounting position of a magnetic field sensor 12 (FIG. 2) for example due to twisting, contributes to the differential angle $\psi_{mag,\Delta}$. The differential angle $\psi_{mag,\Delta}$ is also referred to as declination.

Figure 2:
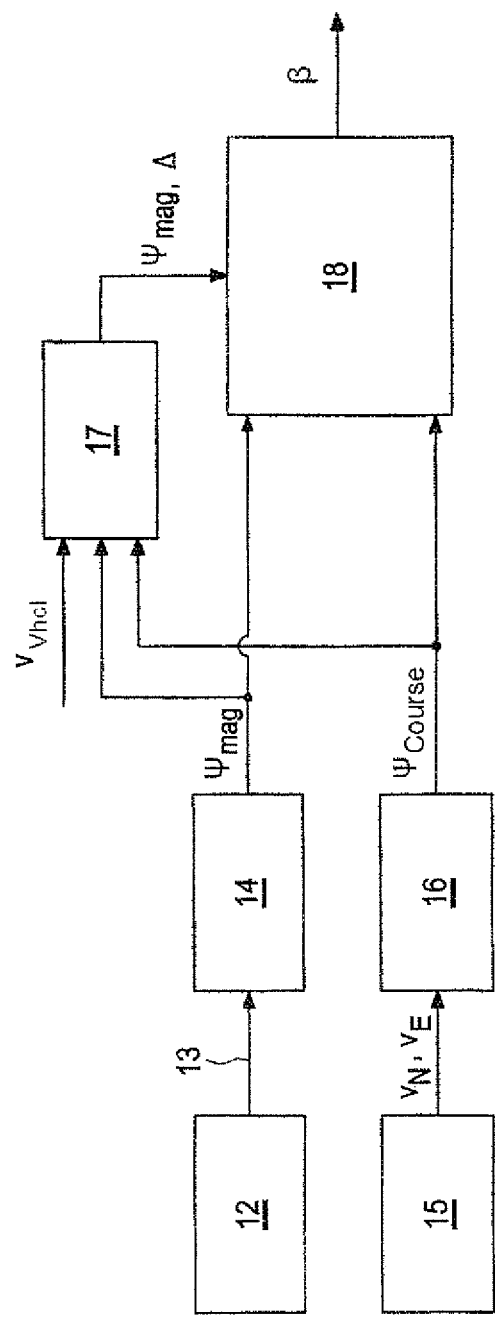
FIG. 2 shows a schematic representation of an exemplary embodiment of the method according to the invention.

The method according to the invention for determining the side slip angle β is described in more detail with reference to FIG. 2. The magnetic field sensor 12 is mounted along the vehicle longitudinal axis x. In an embodiment the magnetic field sensor 12 is configured as a two-axis magnetic field sensor and enables measurement of magnetic field strengths of the earth magnetic field. A two-axes magnetic field sensor is configured for measuring a magnetic filed strength $m_x$ in x-direction, i.e., the vehicle longitudinal direction x, and for measuring a magnetic field strength $m_y$ in y-direction, i.e., along the vehicle transverse direction y. in step 14 of the method according to the invention the magnetic course angle $\psi_{mag,\Delta}$ or yaw angle is calculated via the magnetic field strengths $m_x$ and my from the relationship $\psi_{mag,\Delta} = a\tan 2(m_y, m_x)$.

When constant external interference magnetic fields are present, which may be the case for example due to other electrical devices mounted on the vehicle, or when the magnetic field sensor is tilted excessively it can be advantageous to compensate these interferences via methods known to the person skilled in the art. In particular in the case of excessive tilt angles it is advantageous to combine a 3-axes magnetic filed sensor with a 6D-IMU, which measures three yaw rates and three accelerations in order to compensate the tilt angles out of the magnetic field measurements.

A satellite navigation system 15, such as for example a GPS (Global Positioning System)-sensor which includes a receiver and an antenna or another satellite navigation system (GLONASS, Galileo, Beidou) is also installed in the vehicle and is configured to determine a vehicle speed $v_N$ in geographic north direction N and a vehicle speed $v_E$ in the geographic east direction E. in step 16 of the method according to the invention the course angle $\psi_{course}$ is determined via the relationship $\psi_{course} = a\tan 2(v_E, v_N)$.

Via wheel rotational speed sensors mounted on the wheels of the vehicle 10 the vehicle speed $v_d$ is measured. The measured vehicle speed $v_{vhcl}$ points exclusively in vehicle longitudinal direction x and corresponds to the vehicle longitudinal speed $v_x$ at straight ahead drive without slipping wheels. The orientation of the vehicle speed $v_{vhcl}$ thus corresponds to a vector without side slip angle beta in the direction of the vehicle longitudinal direction x. By means of the measured vehicle speed $v_{vhcl}$, the course angle $\psi_{course}$ and the yaw angle $\psi_{mag}$ a differential angle $\psi_{mag,\Delta}$ is determined in step 17 of the method according to the invention. Hereby it is assumed that the vehicle 10 after a standstill, i.e., $v_{vhcl}=0$, accelerates for a brief time period without side slip angle, i.e., β=0 only in vehicle longitudinal direction x. usually the brief time period is about a few milliseconds, however at least so long until the satellite navigation system provides the values $v_E$ and $v_N$. As soon as these values are available the differential value $\psi_{mag,\Delta}$ is set to $\psi_{mag,\Delta} = \psi_{mag} - \psi_{course}$ and is held until the next vehicle standstill, wherein $\psi_{mag,\Delta}$ designates the differential angle or he declination, $\psi_{mag}$ the orientation of the vehicle in relation to the magnetic north direction M or the yaw angle and $\psi_{course}$ the course angle. The differential angle $\psi_{mag,\Delta}$ is the deviation between the geographic north direction N and the magnetic north direction M of the earth. As a consequence the reliability of the subsequent side slip angle calculation is reduced the longer the vehicle 10 is in motion.

In order to improve the calculation of the differential angle or the declination $\psi_{mag,\Delta}$ further driving situations in which the side slip angle beta is zero can be identified with the vehicle speed $v_{vhcl}$ determined via the wheel rotational sped sensors. For this purpose, measurement values that are typical for driving dynamics such as transverse acceleration, yaw rate steering angle and wheel rotational speed can be used for example to identify straight ahead driving. When all valid differential angles $\psi_{mag,\Delta}$, i.e., all differential angles for which the side slip angle $\beta$ can be assumed to be zero, are stored the declination results as average value $$\psi_{mag,\Delta} = \frac{1}{n}\sum_n \psi_{mag,\Delta,n}.$$

In step 18 of the method according to the invention the side slip angle $\beta$ is determined according to the relationships of FIG. 1 as $\beta = \psi_{course} + \psi_{mag,\Delta} - \psi_{mag}$, wherein $\beta$ designates the side slip angle, $\psi_{mag,\Delta}$ the differential angle or the declination, $\psi_{mag}$ the orientation of the vehicle in relation to the magnetic north direction M or the yaw angle and $\psi_{course}$ the course angle.

With the method according to the invention conclusions can be drawn regarding the side slip angle $\beta$ by using only one antenna of a satellite navigation system 15 and a magnetic field sensor 12 by combining measuring values derived therefrom. Use of a satellite navigation system 15 is widespread in today's vehicles. In contrast to a second satellite navigation antenna a magnetic field sensor 12 is significantly more cost-effective when taking the development costs for integrating the second antenna in the vehicle 10 into account.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed as new and desired to be protected by Letters Patent is set forth in the appended claims and includes equivalents of the elements recited therein:

1. A method for determining a side slip angle in a vehicle, comprising:
    determining with a first sensor an orientation of an effective vehicle speed vector of the vehicle in relation to a geographic coordinate system of the earth;
    determining with a second sensor an orientation of the vehicle in relation to a magnetic coordinate system of the earth magnetic field;
    determining a differential angle of the magnetic north direction of the earth relative to the geographic north direction of the earth by using a vehicle speed; and
    determining the side slip angle as a function of the orientation of the effective vehicle speed vector and the differential angle according to the relationship $\beta = \psi_{course} + \psi_{mag,\Delta} - \psi_{mag}$,
    wherein $\beta$ designates the side slip angle, $\psi_{mag,\Delta}$ the differential angle, $\psi_{mag}$ the orientation of the vehicle in relation to the magnetic north direction and $\psi_{course}$ the orientation of the vehicle speed vector.

2. The method of claim 1, wherein the first sensor is a satellite navigation system, which includes a receiver and an antenna.

3. The method of claim 2, further comprising determining by the satellite navigation device a vehicle speed in the geographic north direction and a vehicle speed in a geographic east direction.

4. The method of claim 3, further comprising holding the side slip angle at zero at least for a time period until the vehicle speed in geographic north direction and the vehicle speed in geographic east direction is provided by the satellite navigation device, and as soon as the vehicle speed in geographic north direction and the vehicle speed in geographic east direction are provided, determining the differential angle once according to the relationship $\psi_{mag,\Delta} = \psi_{mag} - \psi_{course}$, wherein $\psi_{mag,\Delta}$ designates the differential angle or the declination, $\psi_{mag}$ the orientation of the vehicle in relation to the magnetic north direction and $\psi_{course}$ the orientation of the vehicle speed vector.

5. The method of claim 4, further comprising using further measuring variables, that recognize driving situations for which the side slip angle is zero, storing the differential angle for each of the driving situations and determining the differential angle according to the relationship $$\psi_{mag,\Delta} = \frac{1}{n}\sum_n \psi_{mag,\Delta,n},$$

wherein $\psi_{mag,\Delta}$ designates the differential angle or the declination and $\psi_{mag,\Delta}$ the differential angle of a driving situation for which the side slip angle is zero.

6. The method of claim 1, wherein the second sensor is a magnetic field sensor which is mounted along a vehicle longitudinal axis.

7. The method of claim 6, wherein the magnetic field sensor is a two-axes magnetic field sensor.

8. The method of claim 6, wherein the magnetic field sensor is a three-axes magnetic field sensor and is combined with a 6D inertia measuring unit, which is configured to measure three yaw rates and three accelerations.

9. The method of claim 1, wherein for determining the differential angle it is assumed that the vehicle speed vector changes its sign, wherein the side slip angle is zero.

* * * * *